United States Patent
Salisbury

[19]

[11] Patent Number: 5,834,321
[45] Date of Patent: Nov. 10, 1998

[54] LOW NOISE ADDRESS LINE REPAIR METHOD FOR THIN FILM IMAGER DEVICES

[75] Inventor: Roger Stephen Salisbury, Niskayuna, N.Y.

[73] Assignee: General Electric Company, Schenectady, N.Y.

[21] Appl. No.: 574,061

[22] Filed: Dec. 18, 1995

[51] Int. Cl.⁶ .................................................. H01L 21/283
[52] U.S. Cl. .............................. 438/4; 438/690; 438/98; 438/761
[58] Field of Search ................................ 438/4, 759, 760, 438/761, 641, 73, 690, 98, 940, 333, 137; 257/443; 250/370.09

[56] References Cited

U.S. PATENT DOCUMENTS

| | | | |
|---|---|---|---|
| 5,235,272 | 8/1993 | Henley ..................................... | 324/537 |
| 5,397,607 | 3/1995 | Shields et al. ........................... | 427/555 |
| 5,475,246 | 12/1995 | Wei et al. ................................ | 257/291 |
| 5,480,812 | 1/1996 | Salisbury .................................... | 438/4 |
| 5,518,956 | 5/1996 | Liu et al. .................................... | 438/4 |
| 5,543,584 | 8/1996 | Handford et al. ....................... | 174/261 |
| 5,552,607 | 9/1996 | Salisbury et al. .................. | 250/370.09 |
| 5,616,524 | 4/1997 | Wei et al. .................................... | 438/4 |
| 5,648,296 | 7/1997 | Salisbury .................................... | 438/4 |

FOREIGN PATENT DOCUMENTS

| | | |
|---|---|---|
| 02116849 | 5/1990 | Japan . |
| 04307521 | 10/1992 | Japan . |
| 9517768 | 6/1995 | WIPO . |

OTHER PUBLICATIONS

"A Fast In–Line Repair Process for LCD Panel Mass Production", by K. Sheng et al., SID 92 Digest, pp. 636–640.

*Primary Examiner*—John Niebling
*Assistant Examiner*—S. Mulpuri
*Attorney, Agent, or Firm*—Donald S. Ingraham; Douglas E. Stoner

[57] ABSTRACT

A method of repairing an open circuit defect in a damaged address line in a thin film electronic imager array is provided that includes the steps of forming a repair area exposing the open circuit defect and portions of the damaged address line adjoining the defect, with a first protective layer disposed over the array surrounding the repair area; depositing a layer of conductive repair material over the array so that a portion of the conductive repair material is disposed in the repair area to form a repair shunt electrically connecting the portions of the address line adjoining the defect; forming a planarized second protective layer over the array; removing portions of the second protective layer to form a planarized surface on the array on which the conductive repair material is exposed except for the repair shunt underlying a plug portion of the second protective layer disposed over the repair area; removing the conductive repair material from the array surface except for the portion underlying the plug portion of the second protective layer; and removing remaining portions of the first protective layer and the second protective layer plug portion from the repair area.

10 Claims, 2 Drawing Sheets

5,834,321

LOW NOISE ADDRESS LINE REPAIR METHOD FOR THIN FILM IMAGER DEVICES

BACKGROUND OF THE INVENTION

This invention relates generally to thin film electronic imager devices and more particularly to repair of address line structures contained in devices such as solid state radiation imagers having a matrix of electrically conductive address lines for controlling the active components of the device.

Address lines for conducting electrical signals to and from active components in a display or imager device are formed as integral parts of the structure of solid state imagers. These address lines usually form a matrix, with lines running in one direction designated as scan lines and lines disposed in a substantially perpendicular direction designated as data lines. Electrical signals (e.g. the voltage) on a scan line typically control a switching device, such as a field effect transistor (FET, also referred to as a thin film transistor, or TFT), that in turn couples the active component, such as a photosensor, to the data line so that an electrical signal from the photosensor can be read out. A common electrode is disposed over the photosensor array to provide the common contact for each photosensor pixel in the array. The electrical signal that is read out corresponds to the number of detected photons incident on the array, and the signals from the respective photosensors are used to electronically reproduce an image of the photons detected by the array of photosensors.

A defect on a data line can adversely affect overall performance of the thin film imager device. This situation is particularly of concern in imagers in which the data lines have been severed in the middle of the array in order to reduce noise levels (so called "single contact" data lines, as such severed lines are necessarily connected to readout electronics on one side of the array). In this arrangement, it is necessary to be able to read the data lines from each side (or edge) of the array, and an open circuit condition effectively disables all pixels connected to the address line beyond the point where the open circuit exists. Some degradation of the number of operative pixels can be tolerated with appropriate software changes in the read out circuits; replacement of the pixel array (which would be anticipated during the life of the imager), however, would necessarily require revision of the readout software, increasing the time and expense of servicing of the imager. Further, an imager having sufficient defective address lines may have to be discarded, depending upon the degradation of the resolution of the display device resulting from the inoperative pixels.

Given the expense of fabricating thin film electronic imager devices, it is desirable to have devices that are repairable. In particular, it is desirable to have a device that is readily repaired without significant additional processing time during fabrication. It is further desirable that the repair process for data lines that have an open circuit defect be such so as to not significantly increase the amount of electronic noise on the conductive line while still providing repair that is robust.

SUMMARY OF THE INVENTION

In accordance with this invention a method of repairing an open circuit defect in a damaged address line in a thin film electronic imager array is provided that is performed at the point in the fabrication process at which the materials to form the thin film field effect transistors (FETs) and associated data address lines have been deposited and patterned (the "FET complete" stage) and prior to the stage of depositing photosensor barrier layers over the array, such as organic and inorganic dielectric materials deposited after formation of photosensors coupled to respective FETs.

The method of this invention includes the steps of forming a repair area exposing the open circuit defect and portions of the damaged address line adjoining the defect, with a first protective layer disposed over the array surrounding the repair area; depositing a layer of conductive repair material over the array so that a portion of the conductive repair material is disposed in the repair area to form a repair shunt electrically connecting the portions of the address line adjoining the defect; forming a planarized second protective layer over the array; removing portions of the second protective layer to form a planarized surface on the array on which the conductive repair material is exposed except for the repair shunt underlying a plug portion of the second protective layer disposed over the repair area; removing the conductive repair material from the array surface except for the portion underlying the plug portion of the second protective layer; and removing remaining portions of the first protective layer and the second protective layer plug portion from the repair area.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
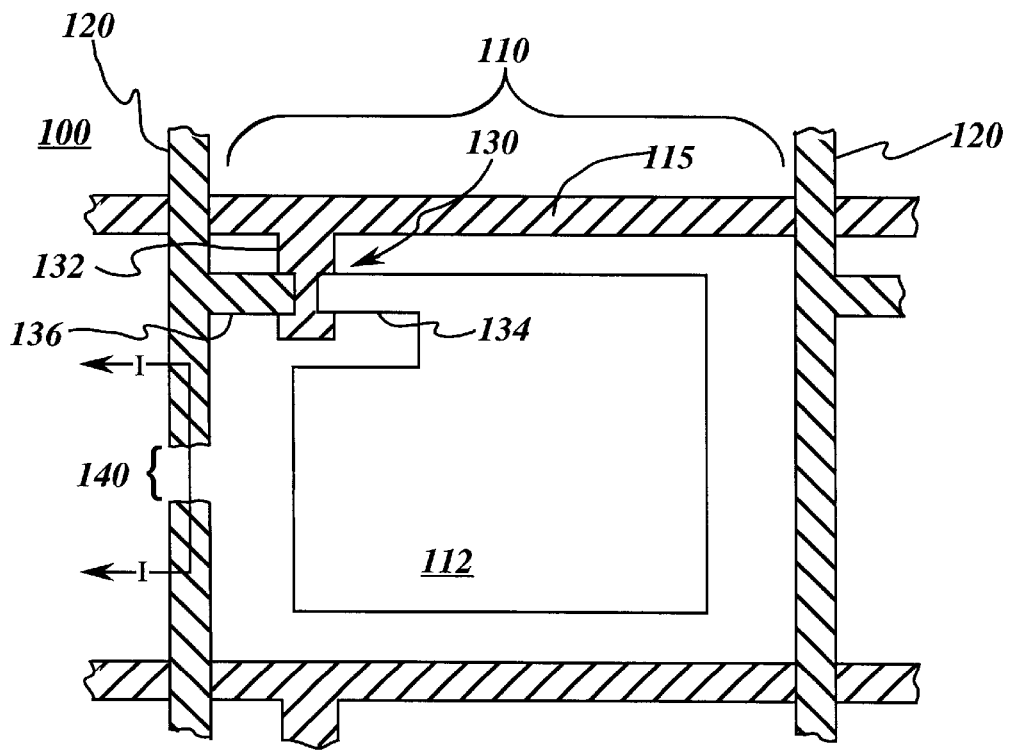
FIG. 1 is a plan view of a portion of a thin film electronic imager array having a damaged address line.

A thin film electronic imager device 100, such as a solid state radiation imager array, typically comprises a plurality of pixels 110 arranged in a matrix of rows and columns (a representative one of which is illustrated in FIG. 1). Pixels in the array are coupled to address lines which include rows of scan lines 115 and columns of data lines 120 via a thin film field effect switching transistor 130 (referred to as a "TFT" or a "FET") such that the charge accumulated by the photosensor in each pixel can be selectively read out during imager operations. Each switching transistor comprises a gate electrode 132 coupled to a respective scan line 115, a drain electrode 134 coupled to a pixel electrode 112; and a source electrode 136 that is coupled to a respective data line 120 (the nomenclature for source and drain electrode 134, 136 is not of critical significance in this structure and thus the nomenclature for the respective electrodes 134, 136 can be reversed without affecting the operation or structure of imager array 100).

FIG. 1 illustrates imager array 100 at an interim step in the fabrication process known as the "FET complete" step. At this point in the fabrication process imager array comprises layers of conductive, semiconductive, and dielectric material that are respectively arranged to form scan lines 115, data lines 120, FETs 130, and pixel electrodes 112; in the typical fabrication process, the next step in the formation of silicon photosensor bodies on pixel electrode 112 and the deposition of multiple layers of organic and inorganic dielectric material to form barriers to protect the photosensors, after which a common electrode is formed over the photosensors and scintillator material is disposed over the common electrode on the array. Often imager fabrication processes do not provide for repair of defects in address lines until after photosensors and barrier layers have been formed; repair at this stage in the fabrication process necessitates removal of barrier layer material from the region of the address line defect prior to being able to repair the defect.

In accordance with this invention, repair of defects in address data lines 120 is accomplished at the "FET complete" stage of the fabrication process. At this point in the fabrication process the electrical continuity of the address lines can be determined and defects located. Defects may include open circuits in spots where the conductive material forming the address line is not continuous, or short circuits, which may necessitate cutting the line, removing the shorted portion, and then reconnecting the severed portions of respective address lines with proper electrical isolation maintained. In either event, it is not uncommon that open circuit conditions in address lines must be corrected. Open circuits in data lines are particularly critical in single contact data lines, that is, data lines which are intentionally severed in the middle of the array to reduce noise in the readout, such that each data line segment, with attached pixels, is coupled to readout electronics at only one edge of the array. At the FET complete stage of the fabrication process, the electrical continuity of address lines can be determined and defects identified.

Figure 2:
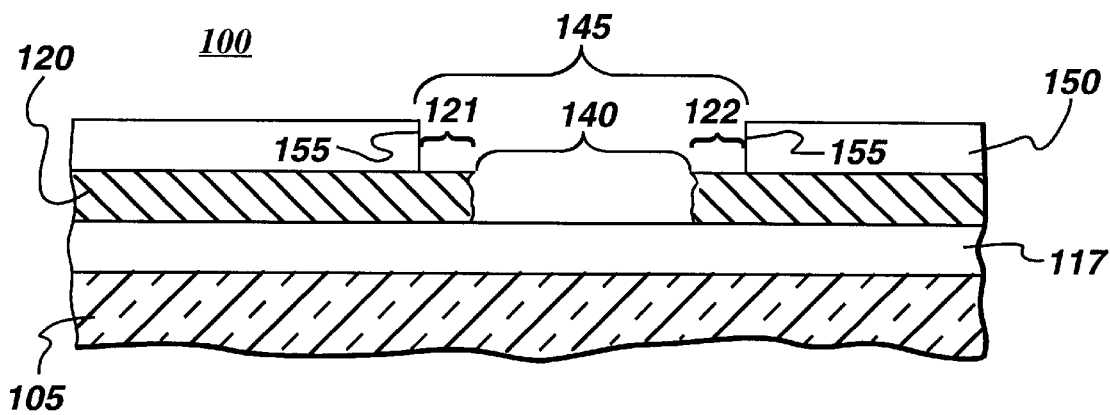
FIG. 2 is a cross-sectional view of the damaged imager array taken along line I—I in FIG. 1 following deposition of a first protective layer and formation of a repair area over the defect in the address line in accordance with this invention.

A portion of address line 120 having a defect 140 is illustrated in cross section in FIG. 2. At the FET complete stage of the fabrication process a gate dielectric layer 117 is disposed on a substrate 105; gate dielectric layer comprises a dielectric material, such as silicon oxide (SiOx) or silicon nitride (SiNx), that is disposed over array 100 to electrical insulate scan lines 115 and insulate associated gate electrodes 132 from succeeding layers of semiconductive and conductive materials (not shown) in TFT 130. Data line 120 is disposed on gate dielectric layer 117 and typically comprises a conductive material such as molybdenum, titanium, aluminum and chromium, or the like. Data line 120 typically has a thickness in the range between about 0.2 μm and 1 μm.

In accordance with this invention, repair of defect 140 is can be commenced once the location of defect 140 has been identified (e.g., by electrical tests and visual inspection). Typically the exposed surface of array 100 (as used herein, the term "exposed surface" refers to the surface of the array opposite substrate 105 as it exists at that point in the fabrication process) is cleaned by applying photoresist stripper or the like to the array. A first protective layer 150 is then deposited in a spin process, meniscus coat process, or the like, over the surface of the array; first protective layer 150 typically comprises an insulative material that can be removed with laser ablation. For example, first protective layer comprises photoresist, polyimide, or similar materials. As used herein, the term "deposited", "formed" or the like used with respect to the formation of a layer of material over the array includes all steps necessary to the formation of such a layer, such as the placement of the material on the array and further normal processing of such material to make it a layer, such as curing the material placed over the array, or the like. The thickness of first protective layer 150 is typically in the range between about 1 μm and about 4 μm, and commonly has a thickness of about 2 μm.

Next, a repair area 145 (FIG. 2) is formed to expose defect 140, a first address line portion 121, and a second address line portion 122 that adjoin defect 140. Typically, portions of first protective layer 150 disposed over repair area 145 are removed by laser ablation to expose defect 140 and adjoining address line segments 121, 122. For example, a Florod brand Model LCM 308 excimer laser has been used at about 7% power (total power being about 350 microjoules) to ablate non-conductive material to form repair area 145 having dimensions of about 10 μm by 20 μm (width, depth, etc.). First and second address line segments 121, 122 collectively comprise areas on each portion of data address line adjoining by open circuit defect 145. Segments 121 and 122 are sufficiently large to allow subsequently deposited conductive material (as discussed below) to make satisfactory electrical contact to data line 120 and to form a stable structure. For example, in a typical imager in which address line 140 has a width of about 7 μm, segments 143 and 144 each have a length of about 10 μm. Additionally, sidewalls 155 of first protective layer 150 are typically also substantially planar (that is, relatively smooth surfaces that are typically disposed substantially vertically between the bottom surface of selected repair area 145 and the upper surface of first protective layer 150). At the completion of this step, repair area 145 is formed with first protective layer 150 surrounding the repair area on the exposed surface of array 100.

Next, a conductive repair material layer 160 is deposited over array 100, typically in a plasma enhanced chemical vapor deposition process or the like, such that the conductive repair material is disposed over the array surface, and a portion of the conductive repair material is disposed in repair area 145 so as to form a repair shunt 165 that electrically couples first data address line segment 121 to second data address line segment 122. Conductive repair material layer comprises the same type of conductive material that comprises data line 120, or alternatively a different type of conductive material. For example, conductive repair material may comprise a metal such as molybdenum, titanium, aluminum, chromium, or the like, or alternatively metal oxide combinations, such as indium tin oxide or the like. Conductive repair material is typically selected to provide a low bulk resistance (e.g., about 100 ohms per square or less) so as to reduce electrical noise in the repaired data line, and such that repair shunt 165 is robust, that is, provides a connection that is electrically and physically sound and that withstands the subsequent fabrication steps to complete that array. Conductive repair material layer 160 typically has a thickness in the range between about 0.8μm and 1.2 μm.

Figure 3:
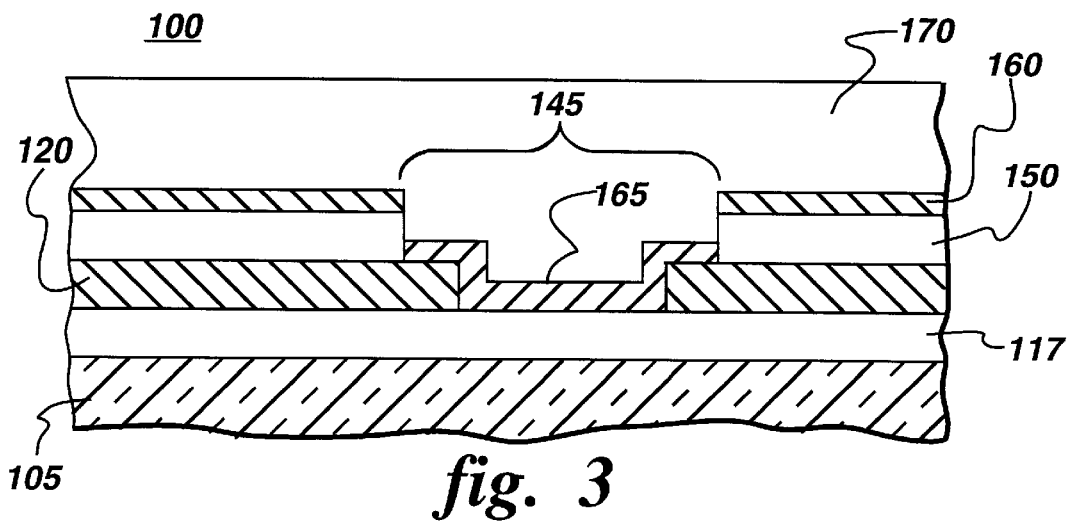
FIG. 3 is a cross-sectional view of the damaged imager array following deposition of the conductive repair material and second protective layer in accordance with the present invention.

Following deposition of conductive repair material layer 160, a planarized second protective layer 170 is formed over array 100. Second protective layer 170 is deposited in a spin process, meniscus coat process, or the like, over the surface of the array that results in the upper surface of second protective layer having a planarized surface, that is, a surface that is substantially parallel to the surface of substrate 105. Second protective layer 170 typically comprises an insulative material that can be removed with laser ablation (e.g., similar to the material comprising first protective layer 150). For example, second protective layer comprises photoresist, polyimide, or similar materials. The thickness of second protective layer 170 is typically in the range between about 1 $\mu$m and 4 $\mu$m, and commonly has a thickness of about 2 $\mu$m in the region outside of repair area 165 (due to the planarized surface, the thickness of second protective layer is greater in repair area 165). At the completion of the formation of planarized second protective layer 170 array 100 appears as illustrated in FIG. 3.

Figure 4:
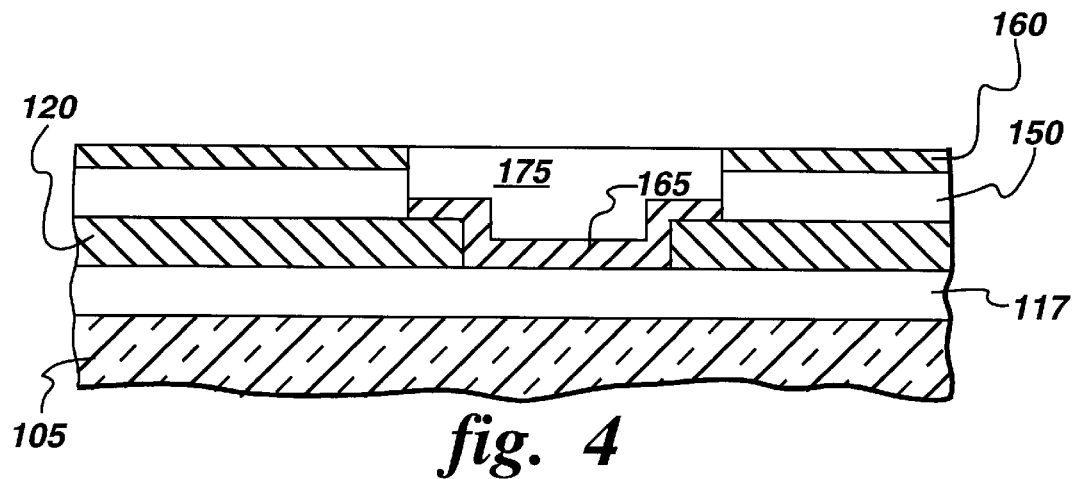
FIG. 4 is a cross-sectional view of the damaged imager array in which the conductive repair material has been exposed except for the repair area in accordance with the present invention.

Portions of second protective layer 170 are then removed so as to form a planarized intermediate surface 168 on array 100 in which conductive repair material layer 160 is exposed (that is, constitutes the upper surface of array 100 at this stage in the process) except for a repair area plug portion 175 disposed over repair area 145. Formation of planarized intermediate surface 168 is accomplished by, for example, a planarized etching process such as oxygen plasma etching device, such as a parallel plate asher or the like. The etch is continued until the surface of conductive repair material 160 is exposed except in repair area 145; protective plug 175 remains disposed over repair shunt 165. At the completion of this step of the process, imager array 100 appears as is illustrated in FIG. 4.

Next, the exposed portions of conductive repair layer 160 are removed from array 100, for example by etching with a batch wet etch process. This etching is continued until all exposed portions of conductive repair material layer 160 are removed from the array, with only repair shunt 165 remaining as it is disposed under and protected from the etching process by protective plug 175. After removal of exposed portions of conductive repair material layer 160, first protective layer 150 (outside of repair area 145) and protective plug 175 remain disposed on the array and form the upper surface of the array at this point in the repair process.

Figure 5:
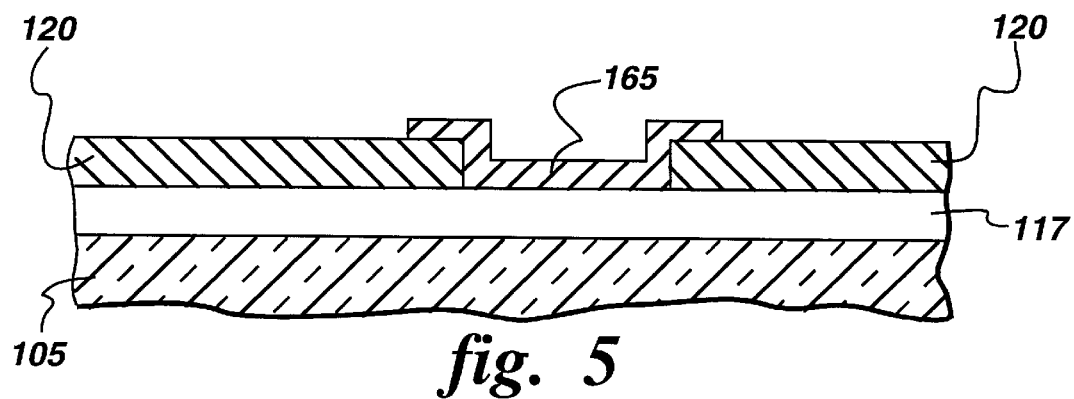
FIG. 5 is a cross-sectional view of an imager array after completion of the address line repair in accordance with the present invention.

To complete the repair process, remaining portions of first protective layer 150 and protective plug 175 are then removed from the array, for example in an oxygen plasma etching process as described above with respect to removal of portions of second protective layer 170. The repaired array appears as illustrated in FIG. 5, with an operation data address line 120 having repair shunt 165. At this point, tests can be performed to confirm the electrical integrity of the array (with additional repairs performed as necessary) and fabrication of array 100 can proceed with formation of photosensors, barrier layers, common electrode, and scintillator (not shown).

The repair process of the present invention thus provides a repair of a data line that can use a wide variety of conductive repair materials, enabling selection of a conductive material that offers low resistance and can provide a low noise repair. If the repair effort is not successful for any reason, it can readily be repeated without adverse effects on other parts of the array, thus providing essentially 100% data line repair yield. Further, given the repair process of this invention, because the repair is effected at the FET complete stage of the array fabrication process, repair shunt 165 is covered by materials deposited on the array in subsequent fabrication steps (as the normal data line is), providing additional protection of repair shunt 165 and making the repair more robust than repair schemes accomplished at later array fabrication stages. This structure also reduces the possibility of electrical leakage between the repair line and subsequently-deposited conductive components in the array. The low-noise data address line repair method of the present invention thus provides high yield and high quality thin film electronic imagers.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of repairing an open circuit defect in a damaged address line in a thin film electronic imager array at an array fabrication step prior to deposition of photosensor barrier layers, the method comprising the steps of:

depositing a first protective layer over said array;

forming a repair area exposing said open circuit defect and portions of said address line adjoining said open circuit defect by ablating portions of said first protective layer disposed over said repair area to expose said open circuit defect and portions of said address line adjoining said open circuit defect;

depositing a layer of conductive repair material over said array, a portion of the conductive repair material layer being disposed in said repair area so as to form a repair shunt repair shunt disposed in electrical contact with said damaged address line portions adjoining said defect so as to electrically bridge said defect;

forming a planarized second protective layer over said array;

removing portions of said planarized second protective layer to form a planarized surface on said array on which said conductive repair material is exposed except for a plug portion of said second protective layer disposed over said repair area;

removing said conductive repair material from said array surface except for repair shunt underlying the second protective layer plug portion; and removing said remaining portions of said first protective layer and said second protective layer plug portion from said array.

2. The method of claim 1 wherein said first protective layer comprises an insulating material selected from the group consisting of photoresist material and polyimide insulation material.

3. The method of claim 2 wherein said first protective layer is deposited to a thickness in the range between 1 $\mu$m and 4 $\mu$m.

4. The method of claim 1 wherein said damaged address line comprises a conductive material and said conductive repair material comprises the same type of conductive material as comprises said damaged address line.

5. The method of claim 1 wherein said damaged address line comprises a conductive material and said conductive repair material comprises the different type of conductive material as comprises said damaged address line.

6. The method of claim 1 wherein said planarized second protective layer comprises an insulating material selected from the group consisting of photoresist material and polyimide insulation material.

7. The method of claim 1 wherein the step of removing portions of said second protective layer to form a planarized surface on said array exposing said conductive repair material except for said plug portion comprises the step of etching said second protective layer in an oxygen plasma.

8. The method of claim 1 wherein the step of removing the conductive repair material exposed after removal of said second protective layer comprises the step of etching said conductive repair material in an etchant selective to the second protective layer material comprising said plug portion.

9. The method of claim 1 wherein the step of removing remaining portions of said first protective layer and said second plug portion comprises etching said array in an oxygen plasma.

10. The method of claim 1 wherein said address line comprises a material selected from the group consisting of molybdenum, titanium, aluminum and chromium.

* * * * *